United States Patent
Ohsumi

(10) Patent No.: US 7,180,185 B2
(45) Date of Patent: Feb. 20, 2007

(54) SEMICONDUCTOR DEVICE WITH CONNECTIONS FOR BUMP ELECTRODES

(75) Inventor: Takashi Ohsumi, Tokyo (JP)

(73) Assignee: Oki Electric Industry Co., Ltd, Tokyo (JP)

(*) Notice: Subject to any disclaimer, the term of this patent is extended or adjusted under 35 U.S.C. 154(b) by 156 days.

(21) Appl. No.: 10/866,195

(22) Filed: Jun. 14, 2004

(65) Prior Publication Data
US 2005/0017356 A1    Jan. 27, 2005

(30) Foreign Application Priority Data
Jun. 13, 2003  (JP)  ............... 2003-169010

(51) Int. Cl.
*H01L 23/48* (2006.01)
(52) U.S. Cl. .................................... 257/737
(58) Field of Classification Search ........ 257/737, 257/738

See application file for complete search history.

(56) References Cited

U.S. PATENT DOCUMENTS
6,075,290 A * 6/2000 Schaefer et al. ............ 257/737

FOREIGN PATENT DOCUMENTS
JP    2002-93945    3/2002

* cited by examiner

*Primary Examiner*—Gene M. Munson
(74) *Attorney, Agent, or Firm*—Rabin & Berdo, P.C.

(57) ABSTRACT

A semiconductor device includes a passivity film, an insulating film and an encapsulating layer, all of which are formed, in this order, on the surface of a semiconductor substrate provided with a connecting pad, and a bump electrode electrically connected to the connecting pad via a wiring passing through a first opening defined in the passivation film and a second opening defined in the insulating film. The bump electrode has a leading end portion exposed from the surface of the encapsulating layer. In the semiconductor device, all of a section of the first opening and all of a section of the second opening as viewed from the direction normal to the surface of the semiconductor substrate are set so as to be contained within a section of the bump electrode as viewed from the direction

5 Claims, 4 Drawing Sheets

PRIOR ART

SEMICONDUCTOR DEVICE WITH CONNECTIONS FOR BUMP ELECTRODES

BACKGROUND OF THE INVENTION

1. Field of the Invention

The present invention relates to a semiconductor device of a chip size package (hereinafter called "CSP: Chip Size (Scale) Package") structure.

This application is counterparts of Japanese patent application, Ser. No. 169010/2003, filed Jun. 13, the subject matter of which is incorporated herein by reference.

2. Description of the Related Art

With a demand for a reduction in the size of electronic equipment, miniaturization and densification of a semiconductor device have been made in recent years. Therefore, a semiconductor device of a CSP structure has been proposed wherein the shape of the semiconductor device is brought closer to a semiconductor element (chip) to reduce its size.

The semiconductor device of the CSP structure needs to enhance the array density of external connecting terminals. Therefore, bump terminals (hereinafter called "bump electrodes") are used which are electrically connected to their corresponding connecting pads as the external connecting terminals and extend vertically from a chip surface.

A general structure of this type of semiconductor device is shown in FIG. 5. In the same drawing, reference numeral 501 indicates a semiconductor substrate formed with an integrated circuit, reference numeral 502 indicates a electrode pad, reference numeral 503 indicates a passivation film, reference numeral 504 indicates an insulating film having an electrical insulating property similar to the passivation film 503, reference numeral 506 indicates a bump electrode, reference numeral 505 indicates a wiring between the electrode pad 502 and the bump electrode 506, reference numeral 507 indicates an encapsulating resin layer, and reference numeral 508 indicates an external terminal made up of solder for connection to the outside.

As a material for the insulating film 504, for example, polyimide relatively high in elasticity is used to relax stress applied to the external terminal 508 and the bump electrode 506 and prevent the occurrence of cracks in a semiconductor integrated circuit containing the passivation film 503 and the electrode pad 502. The thickness of the insulating film ranges from approximately 0.005 to 0.01 mm.

In order to reduce stress applied to the electrode pad 502, such layout design that the bump electrode 506 is formed at a position where it does not overlap an opening (corresponding to a portion in which the insulating film 504 located directly above the electrode pad 502 does not exist) defined in the insulating film 504 when viewed from above is performed. The size of the opening defined in the insulating film 504 ranges from approximately 0.02 to 0.06 mm in diameter, and the size of the bump electrode 506 ranges from approximately 0.15 to 0.4 mm in diameter. This type of semiconductor device has been described in, for example, a patent document 1 (Japanese Laid Open Patent Application No. 2002-93945).

However, there may be cases in which when the area of a chip for an integrated circuit is small or electrode pads provided on the chip are large in number, it becomes difficult to locate the position to form the bump electrode 506 sufficiently away from the opening of the insulating film 504 as shown in FIG. 5, and hence the bump electrode 506 is formed at a position where it overlaps the opening of the insulating film 504. In such a case, there is a large possibility that large stress is applied to each electrode pad so that a crack will occur in the electrode pad. Thus a problem arose in that the reliability of the semiconductor device was deteriorated.

SUMMARY OF THE INVENTION

The present invention has been made in view of the foregoing problem. It is an object of the present invention to enhance the reliability of a semiconductor device of a CSP structure, which is small in chip area and to increase the reliability of a semiconductor device of a CSP structure, in which electrode pads and bump electrodes are large in number.

According to one aspect of the present invention, for achieving the above object, there is provided a semiconductor device comprising a passivation film, an insulating film and an encapsulating layer, all of which are formed, in this order, on the surface of a semiconductor substrate provided with a connecting pad, and a bump electrode electrically connected to the connecting pad via a wiring passing through a first opening defined in the passivation film and a second opening defined in the insulating film, the bump electrode having a leading end portion exposed from the surface of the encapsulating layer. In the semiconductor device, all of a section of the first opening and all of a section of the second opening as viewed from the direction normal to the surface of the semiconductor substrate fall within a section of the bump electrode as viewed from the direction.

Part of the section of the first opening as viewed from the direction normal to the surface of the semiconductor substrate may fall within the section of the bump electrode as viewed from the direction, and all of the section of the second opening may be placed outside the section of the bump electrode.

Part of the section of the first opening as viewed from the direction normal to the surface of the semiconductor substrate may fall within the section of the bump electrode as viewed from the direction, and all of the section of the second opening may fall within the section of the bump electrode.

The above and further objects and novel features of the invention will more fully appear from the following detailed description appended claims and the accompanying drawings.

DETAILED DESCRIPTION OF THE PREFERRED EMBODIMENTS

Preferred embodiments of the present invention will be explained hereinafter in detail with reference to the accompanying drawings.

First Preferred Embodiment

Figure 1A:
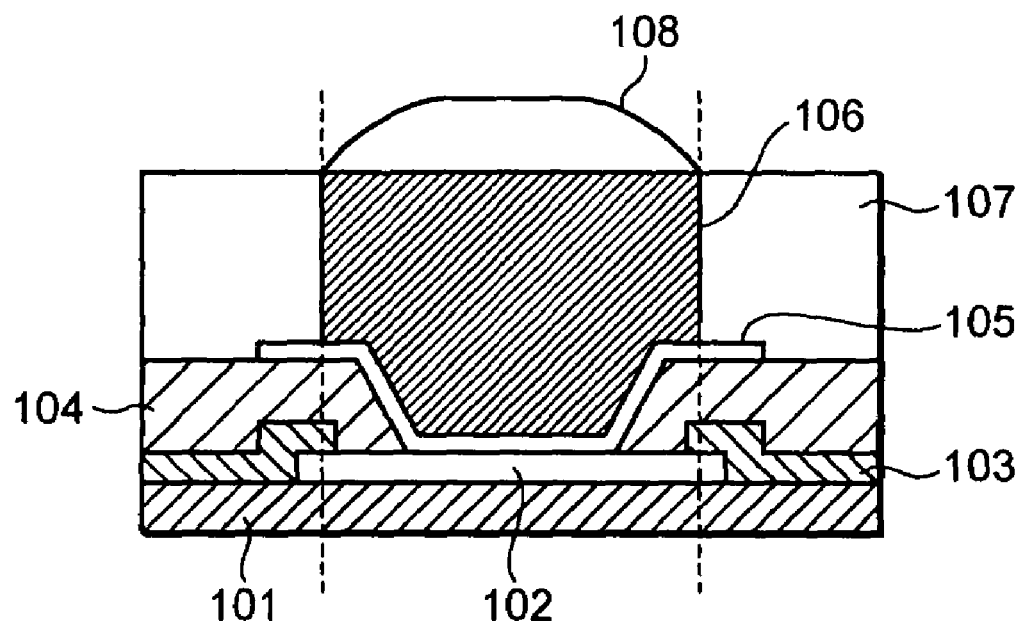
FIG. 1 is a cross-sectional view and a top view showing a structure of a semiconductor device according to a first embodiment of the present invention.

A sectional structure of a semiconductor device of a CSP structure, according to a first embodiment of the present invention is shown in FIG. 1(a). In the same drawing, reference numeral 101 indicates a semiconductor substrate formed with an integrated circuit, reference. numeral 102 indicates a electrode pad, reference numeral 103 indicates a passivation film, reference numeral 104 indicates an insulating film, reference numeral 106 indicates a bump electrode, reference numeral 105 indicates a wiring between the electrode pad 102 and the bump electrode 106, reference numeral 107 indicates an encapsulating resin layer, and reference numeral 108 indicates an external terminal made up of solder for electrically connecting the semiconductor device to its corresponding substrate, respectively.

Figure 1B:
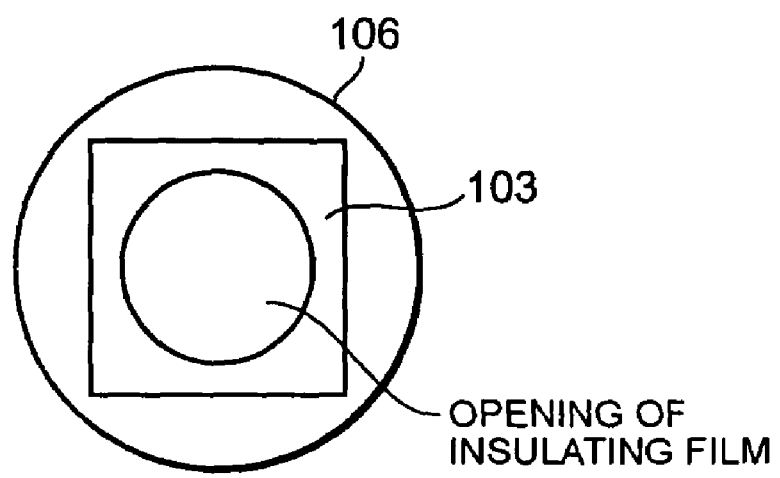

In the present embodiment, the electrode pad 102 and the bump electrode 106 perfectly overlap each other as shown in the top view of in FIG. 1(b). Described specifically, the diameter of an opening defined in the insulating film 104 is smaller than that of the bump electrode 106. The center of an opening defined in the passivation film 103, the center of the opening defined in the insulating film 104, and the center of the bump electrode 106 substantially coincide with one another. The openings defined in the passivation film 103 and the insulating film 104 are perfectly contained in the bump electrode 106 as viewed from above. That is, their openings are formed so as to be positioned inside parallel dotted lines in FIG. 1(a).

In the semiconductor device of the CPS structure, stress applied to the bump electrode portion concentrates on its edge (peripheral edge portion). In the present embodiment, however, the opening of the insulating film 104 is formed small so as to be located directly below the bump electrode 106 and be contained within the section of the bump electrode. Further, the edge of the bump electrode on which the stress concentrates, is supported by the insulating film 104 such as polyimide, which is relatively high in elasticity and shares a stress relaxing function, thereby protecting the passivation film 103 and the electrode pad 102 both disposed therebelow from the occurrence of cracks. Incidentally, the above structure does not necessarily require coincidence of the center of the opening and the center of the bump electrode 106 with each other.

Since the pad structure and the bump electrode structure perfectly overlap each other in the structure of the first embodiment described above, the occupied area of the structure is minimized and hence the effect of enhancing the degree of pattern integration on the semiconductor substrate can be expected.

Second Preferred Embodiment

Although a plurality of the electrode pads and the bump electrodes are formed on a chip in the semiconductor device of the CSP structure, the formation of each bump electrode at a position (at, for example, a distance of less than 500 μm extending from the edge of the chip to the center of the bump electrode) near the edge of the chip falls into difficulties in terms of manufacturing technology. Thus, when the electrode pad is placed in the position near the edge of the chip, such a structure that an electrode pad and a bump electrode partially overlap each other as shown in FIG. 2 may preferably be taken without using the structure shown in FIG. 1.

Figure 2A:
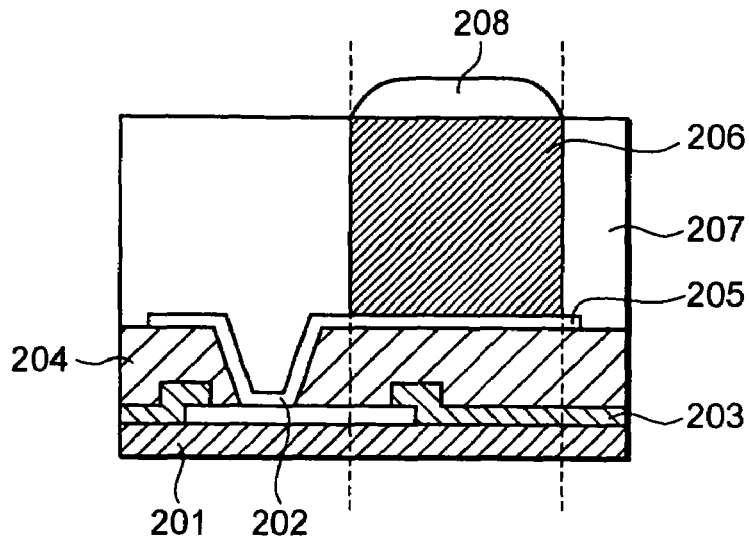
FIG. 2 is a cross-sectional view and a top view illustrating a structure of a semiconductor device according to a second embodiment of the present invention.

In FIG. 2(a), reference numeral 201 indicates a semiconductor substrate formed with an integrated circuit, reference numeral 202 indicates a electrode pad, reference numeral 203 indicates a passivation film, reference numeral 204 indicates an insulating film, reference numeral 206 indicates a bump electrode, reference numeral 205 indicates a wiring between the electrode pad 202 and the bump electrode 206, reference numeral 207 indicates an encapsulating resin layer, and reference numeral 208 indicates an external terminal made up of solder for electrically connecting the semiconductor device to its corresponding substrate, respectively.

Figure 2B:
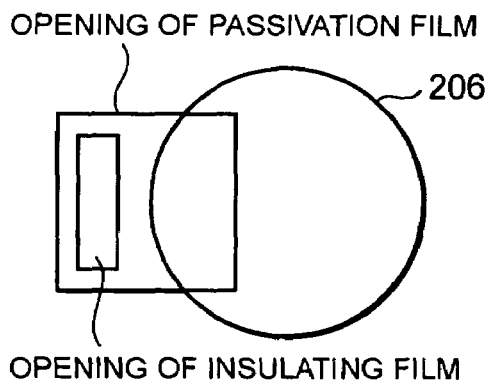

In the present embodiment as shown in the top view of FIG. 2(b), the electrode pad 202 and the bump electrode 206 are configured so as to partly overlap each other at their sections. Described specifically, the section of an opening defined in the passivation film 203 partly falls within the section of the bump electrode 206 as viewed from above. On the other hand, the section of an opening defined in the insulating film 204 is all placed outside the section of the bump electrode 206. That is, as shown in FIG. 2(a), the opening of the insulating film 204 is formed outside parallel dotted lines, whereas the opening of the passivation film 203 is formed at a position where it straddles one dotted line.

Figure 2C:
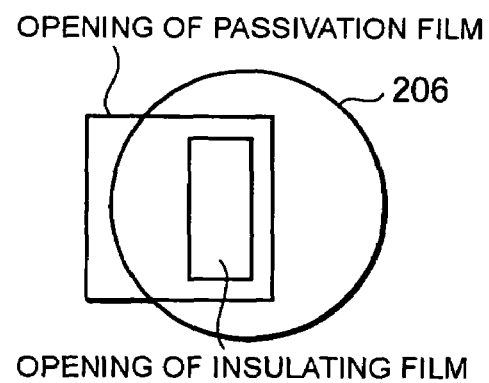
Figure 2D:
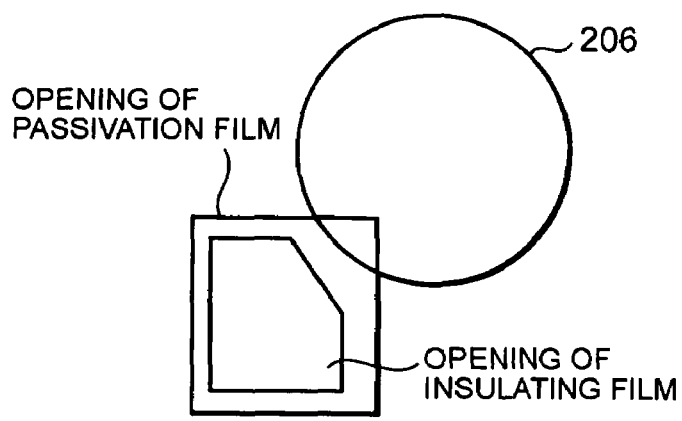

Incidentally, the opening of the insulating film 204 may perfectly be contained within the section of the bump electrode as shown in FIG. 2(c). Although the shape of the opening of the insulating film 204 is rectangular in FIGS. 2(b) and 2(c), the shape thereof may take such a shape as shown in FIG. 2(d) to increase the area of the opening thereof as large as possible where the electrode pad is placed in the neighborhood of the corner of the chip. The shape of the opening can be set to such an arbitrary shape that its area can be increased.

Even in the present embodiment, the opening of the insulating film 204 is formed small outside (or inside) the bump electrode 206, and the edge of the bump electrode 206 on which stress concentrates, is supported by the insulating film 204 such as polyimide, which is relatively high in elasticity and shares a stress relaxing function, thereby making it possible to protect the passivation film and the electrode pad both placed therebelow from the occurrence of cracks.

Figure 3:
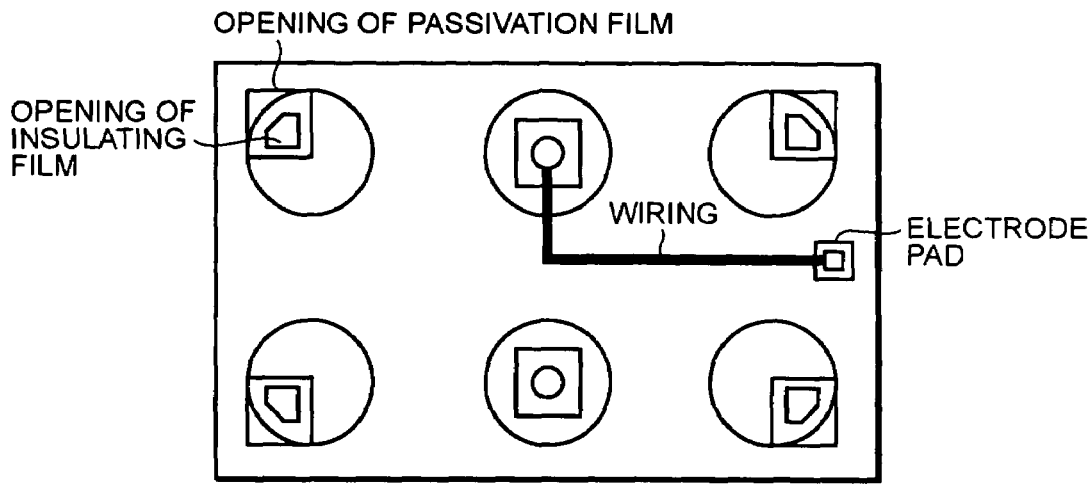
FIG. 3 is a diagram showing one example of layout of at least one electrode pad and bump electrodes of a semiconductor device of a CSP structure.

The structure of the second embodiment is advantageous to cases such as W-CSPackaing of the existing IC, a case in which the pad position has no degree of freedom, and a case in which a pad structure and a bump electrode structure partly overlap each other unavoidably. One example of layout of at least one electrode pad and bump electrodes of the semiconductor device having the structure of the present embodiment is shown in FIG. 3.

Third Preferred Embodiment

Figure 4A:
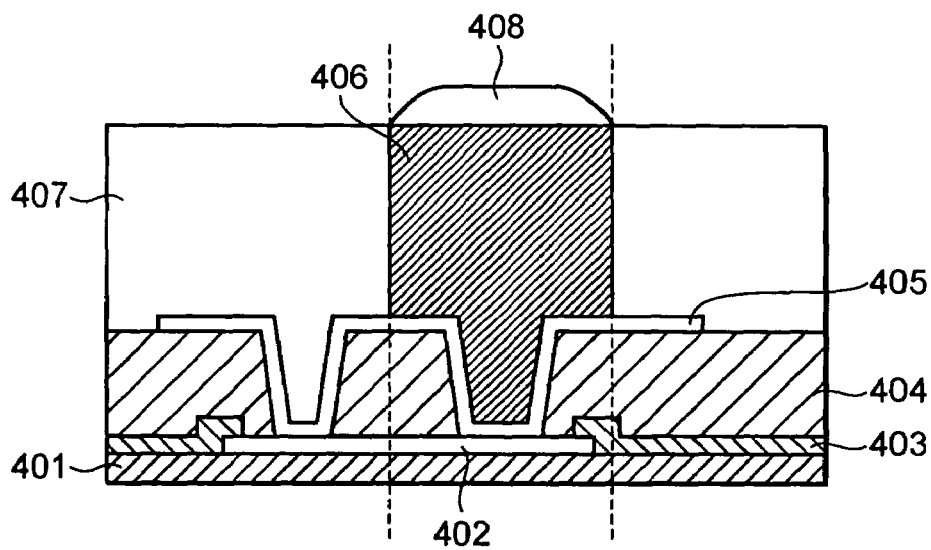
FIG. 4 is a cross-sectional view and a top view illustrating a structure of a semiconductor device according to a third embodiment of the present invention.
Figure 4B:
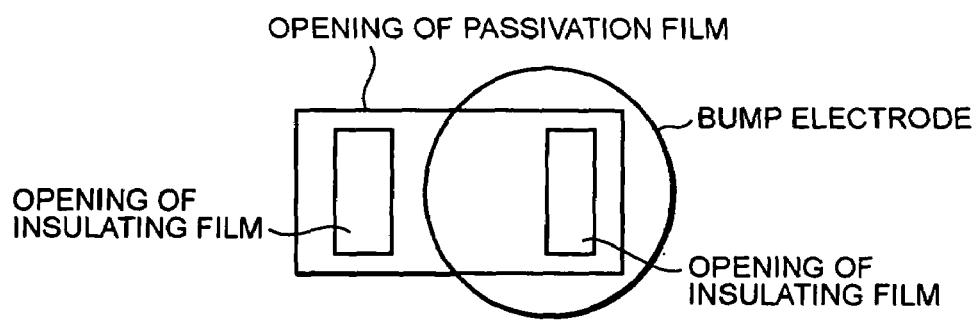
Figure 5:
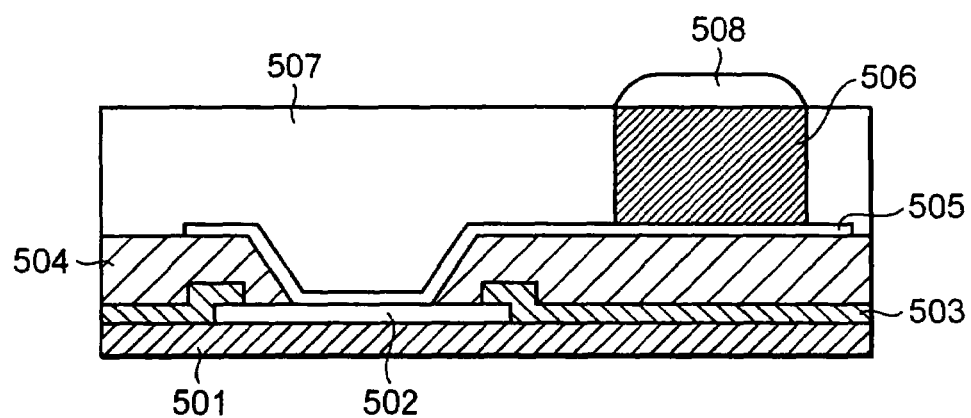
FIG. 5 is a cross-sectional view depicting a structure of a semiconductor device of a conventional CSP structure.

A sectional structure of a semiconductor device of a CSP structure, according to a third embodiment of the present invention is shown in FIG. 4. In FIG. 4(a), reference numeral 401 indicates a semiconductor substrate formed with an integrated circuit, reference numeral 402 indicates a electrode pad, reference numeral 403 indicates a passivation film, reference numeral 404 indicates an insulating film, reference numeral 406 indicates a bump electrode, reference numeral 405 indicates a wiring between the electrode pad 402 and the bump electrode 406, reference numeral 407 indicates an encapsulating resin layer, and reference numeral 408 indicates an external terminal made up of solder for electrically connecting the semiconductor device to its corresponding substrate, respectively.

Although the present embodiment also has a structure wherein the electrode pad and the bump electrode partly overlap at their sections in a manner similar to the second embodiment, the present embodiment is characterized in that two openings are defined in the insulating film 404. Described specifically, as shown in the top view of FIG. 4(b), the insulating film 404 is formed with an opening having such a small diameter that it is perfectly contained within the section of the bump electrode 406, and an opening formed outside the bump electrode 406. Namely, in FIG. 4(a), a first opening is defined within two dotted lines and a second opening is formed on its left side.

The structure of the third embodiment has the effect of being capable of increasing an area for connection between the electrode pad and the wiring from purposes such as the supply of power, ground or the like and reducing its electrical connection resistance in conjunction with the effects of the first and second embodiments.

According to the present invention, it is possible to enhance the reliability of a semiconductor device of a CSP structure, which is small in chip area, and increase the reliability of a semiconductor device of a CSP structure, in which electrode pads and bump electrodes are large in number.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor device comprising:
a passivation film;
an insulating film;
an encapsulating layer;
said passivation film, said insulating film and said encapsulating layer being formed, in this order, on the surface of a semiconductor substrate provided with a electrode pad; and
a bump electrode electrically connected to the electrode pad via a wiring passing through a first opening defined in the passivation film and a second opening defined in the insulating film, said bump electrode having a leading end portion exposed from the surface of the encapsulating layer,
wherein all of a section of the first opening and all of a section of the second opening as viewed from the direction normal to the surface of the semiconductor substrate fall within a section of the bump electrode as viewed from said direction.

2. A semiconductor device comprising:
a passivation film;
an insulating film;
an encapsulating layer;
said passivation film, said insulating film and said encapsulating layer being formed, in this order, on the surface of a semiconductor substrate provided with a electrode pad; and
a bump electrode electrically connected to the electrode pad via a wiring passing through a first opening defined in the passivation film and a second opening defined in the insulating film, said bump electrode having a leading end portion exposed from the surface of the encapsulating layer,
wherein part of a section of the first opening as viewed from the direction normal to the surface of the semiconductor substrate falls within a section of the bump electrode as viewed from said direction, and all of a section of the second opening falls outside the section of the bump electrode and within the section of the first opening.

3. A semiconductor device comprising:
a passivation film;
an insulating film;
an encapsulating layer;
said passivation film, said insulating film and said encapsulating layer being formed, in this order, on the surface of a semiconductor substrate provided with a electrode pad; and
a bump electrode electrically connected to the electrode pad via a wiring passing through a first opening defined in the passivation film and a second opening defined in the insulating film, said bump electrode having a leading end portion exposed from the surface of the encapsulating layer,
wherein part of a section of the first opening as viewed from the direction normal to the surface of the semiconductor substrate falls within a section of the bump electrode as viewed from said direction, and all of a section of the second opening falls within the section of the bump electrode.

4. A semiconductor device comprising:
a passivation film;
an insulating film;
an encapsulating layer;
said passivation film, said insulating film and said encapsulating layer being formed, in this order, on the surface of a semiconductor substrate provided with a electrode pad; and
a bump electrode electrically connected to the electrode pad via a wiring passing through a first opening defined in the passivation film and second and third openings defined in the insulating film, said bump electrode having a leading end portion exposed from the surface of the encapsulating layer,
wherein part of a section of the first opening as viewed from the direction normal to the surface of the semiconductor substrate falls within a section of the bump electrode as viewed from said direction, all of a section of the second opening falls within the section of the bump electrode, and all of a section of the third opening falls outside the section of the bump electrode.

5. A semiconductor device comprising:
a passivation film;
an insulating film;
an encapsulating layer;
said passivation film, said insulating film and said encapsulating layer being formed, in this order, on the surface of a semiconductor substrate provided with electrode pads; and
a plurality of bump electrodes electrically connected to their corresponding electrode pads via wirings each passing through a corresponding first opening defined in the passivation film and a corresponding second opening defined in the insulating film, said each bump electrode having a leading end portion exposed from the surface of the encapsulating layer, wherein each of the plurality of bump electrodes includes any of the following structures:

(1) A structure in which all of a section of the first opening as viewed from the direction normal to the surface of the semiconductor substrate, and all of a section of the second opening fall within a section of the bump electrode as viewed from said direction, (2) A structure in which part of the section of the first opening falls within the section of the bump electrode, and all of the section of the second opening falls outside the section of the bump electrode and within the section of the first opening, and (3) A structure in which part of the section of the first opening falls within the section of the bump electrode, and all of the section of the second opening falls within the section of the bump electrode.

* * * * *